United States Patent [19]
Jones et al.

[11] Patent Number: 5,272,663
[45] Date of Patent: Dec. 21, 1993

[54] APPARATUS AND METHOD FOR WIDE BANDWIDTH ADAPTIVE FILTERING

[75] Inventors: Douglas L. Jones, Champaign; Billy J. Hunsinger, Urbana, both of Ill.

[73] Assignee: The Board of Trustees of the University of Illinois, Urbana, Ill.

[21] Appl. No.: 878,842

[22] Filed: May 5, 1992

[51] Int. Cl.$^5$ .............................................. G06G 7/02
[52] U.S. Cl. ..................................................... 364/825
[58] Field of Search ......................... 364/825, 724.19; 333/150, 166

[56] References Cited

U.S. PATENT DOCUMENTS

| | | | |
|---|---|---|---|
| 4,417,317 | 11/1983 | White et al. | 364/825 |
| 4,633,285 | 12/1986 | Hunsinger | 357/26 |
| 4,656,601 | 4/1987 | Merritt et al. | 364/825 X |
| 4,661,923 | 4/1987 | Grudkowski et al. | 364/825 X |
| 4,726,035 | 2/1988 | Bullock et al. | 364/825 X |

OTHER PUBLICATIONS

Sondhi et al, "New Results on the Performance of a Well-Known Class of Adaptive Filters", Proc. of the IEEE, vol. 64, No. 11, Nov. 1976, pp. 1583-1597.
Feintuch, "An Adaptive Recursive LMS Filter", Proc. of the IEEE, vol. 64, No. 11, Nov. 1976, pp. 1622-1624.
Hoskins, et al. "Charge Transport by Surface Acoustic Waves in GaAs." *Applied Physics Letters*, vol. 41, Aug. 1982.
Kansy, et al., "Acoustic Charge Transport Signal Processors," *Microwave Journal*, Nov. 1988.
Gardner, "Learning characteristics of stochastic--gradient-descent algorithms: a general study, anaylsis, and critique" *Signal Processing*, vol. 6, pp. 113-133, 1984.
I. Chung and S. Ann, "On the asympotomatic analysis of the smoothed least mean square algorithm and the relation with other LMS-type algorithms," *IEEE Trans. on Cir. and Sys.* vol. 38, No. 12, pp. 1551-1554, Dec. 1991.

*Primary Examiner*—Tan V. Mai
*Attorney, Agent, or Firm*—Marshall, O'Toole, Gerstein, Murray & Borun

[57] ABSTRACT

Method and apparatus for adaptive filtering a first signal to produce a second signal that approximates a desired signal including an acoustic charge transport type programmable transversal filter (PTF) having a number of taps where each tap corresponds to an associated delayed first signal and each tap having means for providing a variable tap weight to modify the filter response. The first signal is coupled to the PTF and the output of the PTF produces the second signal. A summer compares the output of the PTF and the desired signal to produce an error signal. A programmable delay line has time delays programmable to integer multiples of the PTF tap spacing to provide a delayed version of the first signal, and a multiplier multiplies the error signal and the delayed input of the programmable delay line to produce a gradient signal. The gradient signal is filtered with an analog lowpass filter to produce a filtered gradient signal which in turn is converted to a digital signal by a low bandwidth analog to digital converter. A microprocessor implements a filtered gradient algorithm to update the PTF filter tap, load the new tap weight into the PTF, and reconfigure the programmable delay line to produce a filtered gradient for another tap. The comparison of the PTF output with the desired signal continues to develop an error signal and the adaptive process is repeated until the error signal becomes substantially zero which results in the second signal more closely approximating the desired signal.

12 Claims, 2 Drawing Sheets

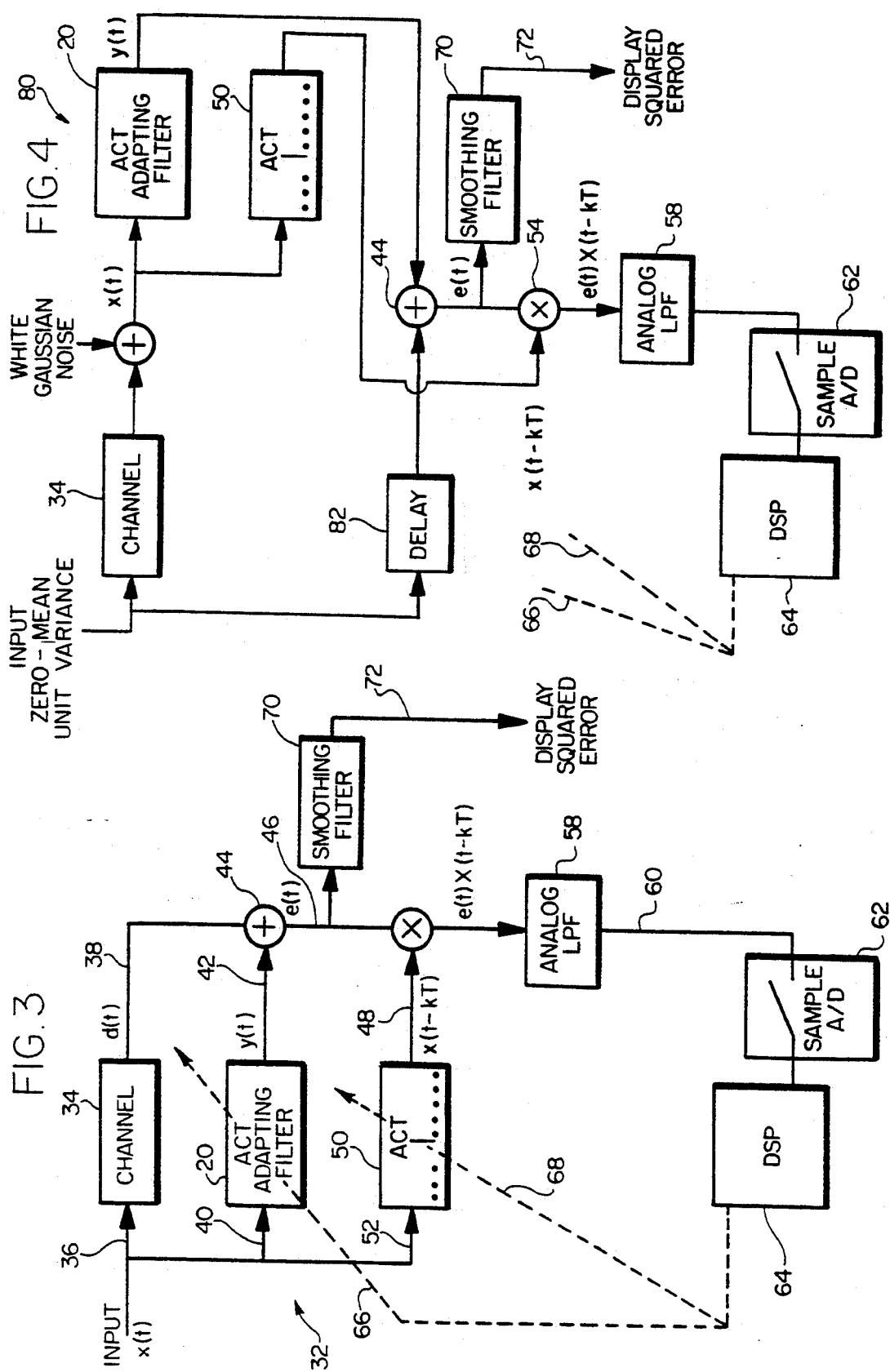

APPARATUS AND METHOD FOR WIDE BANDWIDTH ADAPTIVE FILTERING

FIELD OF THE INVENTION

This invention relates to adaptive filtering and in particular to adaptive filtering using a programmable transversal filter.

BACKGROUND OF THE INVENTION

Adaptive filters attempt to minimize the error between a desired signal which is related to the desired output of the adaptive filter, and the actual adaptive filter output. An adaptive equalizer is built around an adaptive filter. Several different forms of equalizers exist, all of which can be constructed using an adaptive filter as the core element.

In recent years adaptive equalization has received increasing attention for the equalization of magnetic recording channels, such as those in disk drives of a typical modern computing environment. The ultimate goal is to equalize the disk channel and improve the packing density of digital information that can be written on the disk.

Adaptive equalizers also find desired application in wide bandwidth communication channels and systems, such as microwave modems, satellite communication links, etc. Channel impairments caused by bandwidth restrictions and nonlinear phase distortion limit the rates at which binary information can be transmitted through practical communication channels. When pulses are transmitted over an impaired channel in rapid succession, the rate at which they can be transmitted is limited by the intersymbol interference which occurs when the distorted pulses overlap with each other and cause increased error rates in the detection stage of the receiver. An adaptive equalizer in this communication channel application is an adjustable filter in the receiver used to automatically identify channel characteristics and to equalize the channel in the sense of providing the best approximation to an ideal channel by the combination of the physical (non-ideal) channel and the equalizer.

Adaptive equalization has been particularly successful in telephone communications and in high speed modems used for transmitting binary information between computers. Since digital filters can easily operate at these narrow bandwidths and at these data rates, most equalizers are currently implemented as all digital component adaptive filters. However, in radar and spread spectrum communication systems that typically operate with wide bandwidths in the 1.0 mHz to 100 mHz range, it is generally quite expensive to use digital filters because of the added expense of required wide bandwidth analog to digital converters and digital to analog converters.

Currently available technology for wide bandwidth adaptive filtering, primarily for equalization, consists of all analog component systems, which can achieve bandwidths of several hundred megahertz but which typically support only three to five taps so that such systems cannot achieve high resolution equalization. Also, such all analog systems are not useful for application in digital systems.

It is therefore desired to provide apparatus and methods for adaptive filtering with wide bandwidth performance at lower cost, with a high resolution of equalization achievable and which adaptive filtering may be applied to digital systems.

SUMMARY OF THE INVENTION

In accordance with the principles of the present invention, there is provided a high performance, wide bandwidth adaptive filter which includes a high speed programmable transversal filter (PTF) having several spaced taps each corresponding to a respective time delay for a signal propagating through the PTF. Each tap also has an associated tap weight which may be changed to vary the PTF response characteristics. The PTF is coupled to a first input signal and provides an output which is compared to a desired signal to provide an error signal. The adaptive filter updates the PTF tap weights so that the PTF output increasingly approaches the desired signal.

A delay line is also coupled to the input signal to provide a delayed input signal. Multiplier means multiply the error signal and the delayed input signal and provide a digital gradient output signal. A digital signal processor calculates the update of one tap weight of the programmable transversal filter at a time according to a filtered gradient least-mean-squares algorithm, i.e.

$$a_k(n+1) = a_k(n) + \mu F_s\{e(t)x(t-kT)\}. \tag{1}$$

where $a_k$ denotes the tap weight coefficient for the k-th tap weight, n denotes the discrete-time index of the update sequence, $F_s\{\ \}$ denotes that the analog product produced by the multiplier has been lowpass filtered and sampled at a rate that is compatible with the signal processor, T is the programmable transversal filter tap spacing in time, and $\mu$ is a weighting factor. The updates of the filter coefficients (PTF tap weights) are performed at a much lower rate than the filter computation, thereby enabling the use of an inexpensive hybrid digital/analog circuit in accordance with the present invention.

In accordance with the preferred embodiment of the present invention, an acoustic charge transport (ACT) device is utilized as the programmable transversal filter (PTF) although it is to be understood that the present invention can be implemented with any high speed programmable transversal filter technology. At the present time, an ACT type PTF is the most cost effective technique available.

Utilizing an ACT type PTF in the adaptive filter aspect of the present invention is particularly useful for application in a wide variety of electronic system engineering problems where it is necessary to dynamically modify the filter function. Such dynamic modification of a filter function is required in many adaptive filtering applications, such as channel identification, adaptive equalization, adaptive noise canceling, adaptive echo canceling, adaptive line enhancing, etc.

In a channel modeling embodiment of the invention, an ACT type PTF device with 128 taps is used where each tap is weighted by a five bit programmable attenuator to perform the desired filtering operation. The tap weights are stored in a random access memory which is integrated with the ACT device. The ACT type PTF device is capable of filtering signals at an equivalent digital sampling rate of nearly 200 mHz.

In an example of the preferred embodiment of the invention, communication channel modeling is achieved using this ACT based PTF device. The communication channel under study is coupled to an input signal. The ACT type PTF device also is coupled to the input signal. The output of the communication channel and the output of the ACT based PTF are then compared to provide an error signal. A delayed input signal is produced by a second ACT type PTF device configured as a programmable delay line and the output of the delay line and the previously obtained error signal are multiplied using a wide bandwidth four-quadrant analog multiplier to provide a gradient signal which in turn is filtered with a lowpass filter to provide a filtered, i.e. average gradient. This filtered gradient signal is then sampled by a low bandwidth, inexpensive, analog to digital converter.

A digital signal processor applies the weighting factor, calculates the update of one tap weight in accordance with the filtered gradient algorithm (1) above, and loads the new tap weight value into the ACT based PTF device. The digital signal processor also reconfigures the PTF configured as a programmable delay line so as to produce a filtered gradient for another tap of the ACT based PTF device. This adaptation continues with the digital signal processor updating a coefficient of the filtered gradient algorithm (1) each time, and each time the programmable delay line is set to the next tap position corresponding to the ACT based PTF tap.

Continued adaptation in accordance with the above described process results in the output of the ACT based PTF device rapidly approaching the same signal as the output of the communication channel so that the error function becomes minimal. The adaptive filter is therefore used to model the communication channel which process has significant advantages in various fields. The present invention may be used for instance in control situations where one is interested in designing a control for optimum operation, or in radar operations where the returning impulse response may be readily investigated.

In another aspect of the present invention channel equalization is provided using an adaptive equalizer containing an ACT type PTF device and a second PTF configured as a programmable delay line. A second delay line is also used to account for the delay through the communication channel and the adaptive equalizer to provide an output signal which is compared to the adaptive equalizer output signal to develop an error signal. The adaptive equalizer of the present invention provides an impulse response for the equalized channel which is virtually identical to the undistorted channel.

The present invention therefore provides a high performance wide bandwidth adaptive filter. A significant advantage of the present invention resides in the unique combination of an ACT based analog transversal filter and a hybrid analog/digital variant of the filtered gradient least-mean-square adaptive filter algorithm to enable the benefits of both analog and digital technology to be attained.

The present adaptive filter of this invention can also be applied to other adaptive filtering applications such as adaptive noise canceling, adaptive echo canceling, etc. Such applications are well within the skill of the art and the present invention can be readily applied thereto in accordance with the present teachings.

BRIEF DESCRIPTION OF THE DRAWINGS

The features of this invention which are believed to be novel are set forth with particularity in the appended claims. The invention may be best understood by reference to the following description taken in conjunction with the accompanying drawings, in which like reference numerals identify like elements in the several FIGURES and in which:

FIG. 3 is a schematic block diagram illustrating a channel modeling system including an adaptive filter with an ACT type PTF in accordance with the principles of the present invention; and FIG. 4 is a schematic block diagram illustrating an adaptive equalization system utilizing an adaptive filter in accordance with the present invention.

DETAILED DESCRIPTION

Figure 1:
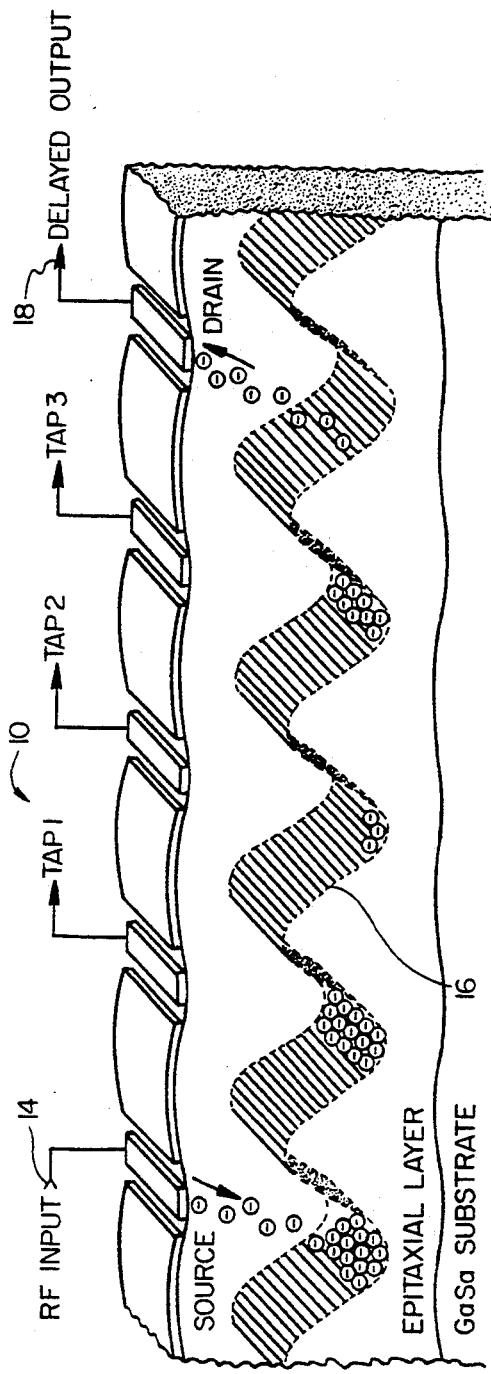
FIG. 1 is a schematic illustration of an acoustic charge transport (ACT) device as known in the art.

Reference may be made to FIG. 1, which illustrates an acoustic charge transport (ACT) device 10 of the type described in U.S. Pat. No. 4,633,285, assigned to the same assignee as herein. ACT device 10 is a high speed monolithic charge transport device that provides the fundamental function of radio frequency signal delay. A piezoelectric material 12 includes a series of taps i.e. tap 1, tap 2, tap 3, on a top surface. An RF signal coupled to an input terminal 14 is delayed in transmission through the piezoelectric material by means of an ultrasonic transducer induced surface acoustic wave which propagates at the speed of sound across the crystal surface. The surface wave induces a sinusoidal variation 16 in the electric potential of an epitaxial layer which interacts with the RF signal so that a delayed RF output signal is provided at output terminal 18 of the ACT device 10.

Figure 2:
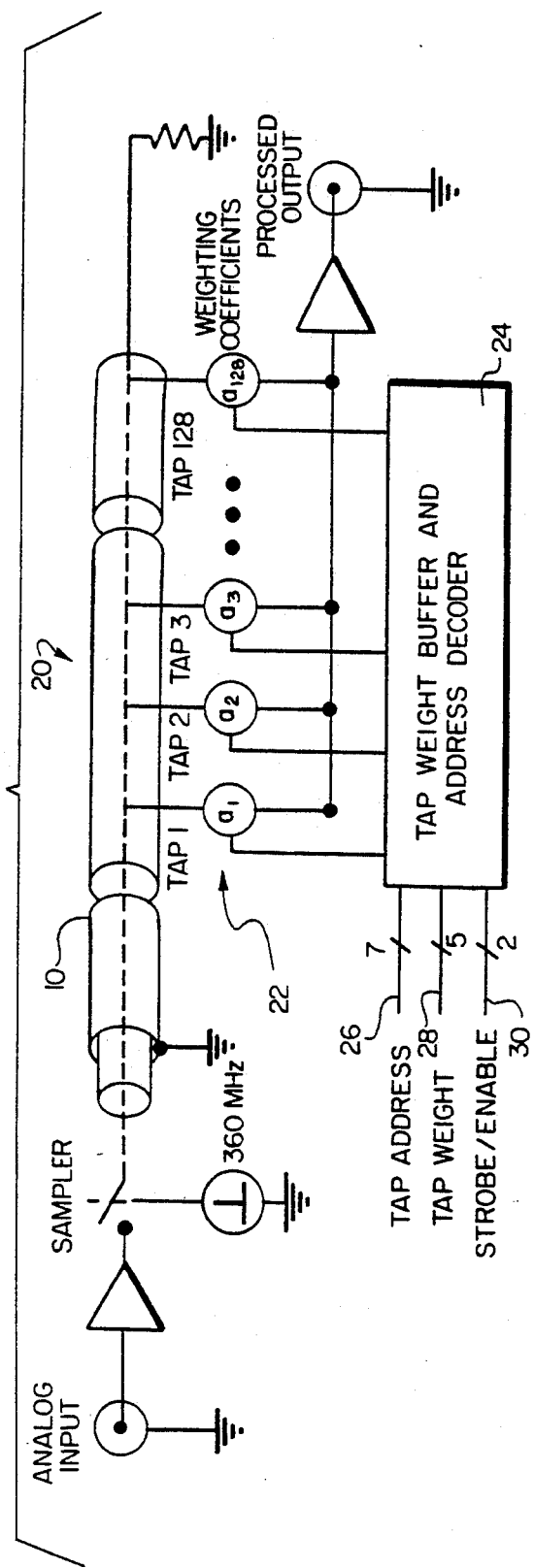
FIG. 2 is a schematic illustration of an ACT type programmable transversal filter (PTF)

FIG. 2 illustrates the application of an ACT device for finite impulse response filtering with an ACT programmable transversal filter (PTF) 20. PTF 20 includes an ACT device 10 with taps indicated in FIG. 2 as tap 1, tap 2, tap 3 . . . tap 128. ACT device 10 converts the input signal into a series of electron packets which are transported in the traveling potential wells of the surface acoustic wave. As the charge packets propagate down the ACT delay line, non-destructive sensing electrodes at the spaced tap positions, tap 1, tap 2, etc., are used to tap the signal at fixed intervals.

In FIG. 2, the signal sensed by each tap is weighted by a five bit programmable attenuator and summed with the signals from all 128 taps to perform the finite impulse response filtering operation. The tap weights 22, denoted $a_1$ to $a_{128}$ are stored in a $5 \times 128$ random access memory circuit which is monolithically integrated with the ACT delay line. A tap weight buffer and address decoder 24 is coupled between the tap weights 22 and a signal processor and includes respective inputs from the processor including a tap address input 26, a tap weight input 28, and a strobe enable input 30 to perform the finite impulse response filtering by updating the filter coefficients (taps).

An ACT type programmable transversal filter 20 as shown in FIG. 2 is commercially available as model no. PTF3 manufactured by Electronic Decisions, Inc. of Urbana, Illinois. This available ACT type PTF device provides a digitally programmable finite impulse response analog filter with 128 taps that operates effectively with up to 90 mHz of bandwidth.

Referring now to FIG. 3, there is illustrated channel identification apparatus 32 including adaptive filtering in accordance with the preferred embodiment of the present invention to identify the characteristics of a channel 34. It is understood that channel 34 represents a communication channel or any other type of signal channel which receives an analog input x(t) at an input line 36 and provides an analog output signal d(t) on output line 38. The output signal d(t) from channel 34 is the analog desired signal.

An ACT type PTF device 20 has its input line 40 coupled to the analog input signal x(t) and provides an analog output y(t) on output line 42. An analog summing circuit 44 compares the channel 34 output with the output of the ACT type PTF 20 by subtracting one from the other to create an error signal e(t) on line 46.

A delayed input signal x(t-kT) on line 48 is provided by a second ACT type PTF 50 that is configured as a programmable delay line with its input line 52 connected to the analog input signal x(t). The time delays of PTF 50 are programmable to integer multiples of the spaced taps of PTF 20. The error signal on line 46 and the delayed input signal on line 48 are multiplied in a multiplier 54 so that the output on line 56 is a gradient signal comprising the product of the error signal and the delayed input signal. Multiplier 54 can be a model AD834 wideband four-quadrant analog multiplier commercially available from Analog Devices, Inc. of Norwood, Mass.

The analog product at line 56 at the output of multiplier 54 is then passed through a lowpass filter which has a bandwidth (as defined by a corner frequency) preferably of about one-half the sampling frequency, which also performs the approximate function of an integrator. The output of lowpass filter 58 on line 60 is therefore a filtered gradient, i.e. an averaged version of the output of PTF 20. The filtered gradient signal on line 60 is then sampled by a low bandwidth (and therefore inexpensive) analog to digital converter 62 at a rate of about 48 kHz, which is almost 4,000 times slower than the sampling rate of PTF 20. The digital samples from analog to digital converter 62 are then coupled to a digital processor 64, such as a Motorola 56001 DSP chip. Processor 64 digitally supplies a $\mu$ weighting factor and calculates the update of one tap weight at a time according to the following adaptive algorithm:

$$a_k(n+1) = a_k(n) + \mu F_s e(t) \times (t - kT), \quad (1)$$

where $a_k$ denotes the tap weight coefficient for the k-th tap weight, n denotes the discrete-time index of the update sequence, $F_s\{\ \}$ denotes that the analog product produced by the multiplier has been lowpass filtered and sampled at a rate that is compatible with the signal processor, T is the programmable transversal filter tap spacing in time, and $\mu$ is a weighting factor.

As the processor 64 updates the filter tap according to the adaptive algorithm, it also loads the new value into the ACT type PTF 20, and reconfigures the analog delay line 50 to produce a filtered gradient for another tap. In FIG. 3, updating PTF 20 is represented by the dashed line 66 and the reconfiguring of analog delay line 50 is represented by dashed line 68, both of which are coupled from the output of processor 64.

The adaptive filtering process continues with the processor updating one tap weight coefficient at each time iteration, cycling through all 128 taps in a desired sequence. This sequential updating of the coefficients implies that the adaptation process will be slower than if a more familiar algorithm is used to update all coefficients at each iteration. However, simulated results have shown that this lower rate can be partially compensated by increasing the $\mu$ factor. It is understood of course that if desired, the algorithm directing the update of all coefficients at each iteration can be provided if desired.

A smoothing filter 70 may be utilized so that a resulting squared error signal on line 72 is coupled to a display monitor to identify when and to what extent the adaptive filter has minimized the error function so that the signals from PTF 20 and channel 34 are substantially identical. Accordingly, the PTF 20 in channel identifier apparatus 32 has been adjusted through adaptive filtering according to the present invention to match the characteristics of channel 34.

The use of the above-described adaptive filter structure in the traditional applications of adaptive filtering can be readily applied to such fields as equalization, system identification, interference cancellation, and adaptive line enhancement. The use of these techniques in either an on-line, continuously adapting system, or as an initial training algorithm to determine fixed filter coefficients to be used subsequent to the training, can be readily accomplished.

Reference may now be made to FIG. 4 which illustrates a channel equalizer 80 incorporating adaptive filtering in accordance with this invention. Most of the components of FIG. 4 are the same as shown in FIG. 3. Another delay line 82 is provided to account for the delay through channel 34 and PTF 20.

In the channel equalizer 80 of FIG. 4, lowpass filter 58 is provided by a first order Butterworth lowpass filter to smooth the gradient estimate and to band limit the output of multiplier 54 so it can be sampled at a rate that is compatible with the processing speed of processor 64. The remaining components of FIG. 4 are the same as the components shown in FIG. 3.

In accordance with the principles of the present invention, channel equalizer 80 provides an adaptive equalizer which effectively equalizes the channel model so that the output of the combination of channel 34 and the adaptive filter (i.e. PTF 20 cascaded with channel 34) is virtually identical to the input signal. It is to be understood that the illustration of channel equalization shown in FIG. 4 is presented only to illustrate the principles of the present invention. Actual realization of channel equalization could utilize either decision feedback, a preprogrammed training sequence known to both transmitter and receiver, or other well known procedures.

It is understood of course that the principles of the present invention can be provided to other situations involving adaptive filters and equalizers.

The foregoing detailed description has been given for clearness of understanding only, and no unnecessary limitations should be understood therefrom, as modifications will be obvious to those skilled in the art.

I claim:

1. Apparatus for adaptive filtering a first analog signal to produce a second analog signal that approximates a desired signal, said apparatus comprising:

a programmable transversal filter (PTF) including an acoustic charge transport device coupled to said first analog signal and having a plurality of spaced taps each corresponding to an associated delayed first analog signal, each tap including means for providing a variable tap weight for modifying the filter response and providing said second analog signal;

means for comparing said desired signal and said second analog signal and providing an error signal;

time delay means for delaying said first analog signal and providing a delayed first analog signal corresponding to a delayed first analog signal at a selected tap;

multiplying means for multiplying the error signal and the delayed first analog signal from said time delay means to provide a gradient signal;

filter means coupled to said gradient signal for providing a filtered gradient signal; and a digital signal processor coupled to the filtered gradient signal and to the PTF for deriving a new updated tap weight for the selected tap in response to the filtered gradient signal and for varying the tap weight of the selected tap in accordance with said new updated tap weight to drive the second signal to more closely approximate the desired signal.

2. Apparatus according to claim 1, wherein said time delay means includes a second PTF.

3. Apparatus according to claim 2, wherein said second PTF includes an acoustic charge transport device with time delays programmable to integer multiples of the spaced taps of said first PTF.

4. Apparatus according to claim 2, wherein said filter means includes a lowpass filter to provide said filtered gradient signal.

5. Apparatus according to claim 4, wherein said filter means includes converting means for sampling said filtered gradient signal at a rate compatible with said digital processor.

6. Apparatus according to claim 5, wherein said converting means includes an analog to digital converter.

7. Apparatus according to claim 6, wherein said digital signal processor derives said new updated tap weight in accordance with the algorithm, $$a_k(n+1) = a_k(n) + \mu F_s\{e(t) \times (t-kT)\},$$

where $a_k$ denotes the tap weight coefficient for the k-th tap weight, n denotes the discrete-time index of the update sequence, $\mu$ denotes a weighting factor, T denotes the selected taps spacing of the first PTF, and $F_s\{\ \}$ denotes that the analog product produced by said multiplying means has been lowpass filtered and sampled at a rate that is compatible with said digital signal processor.

8. Apparatus according to claim 1, including means for selecting a new updated tap, deriving a new updated tap weight for the new updated tap in accordance with the new updated tap weight to continue to drive the second signal to more closely approximate the desired signal.

9. A method of adaptive filtering a first analog signal to produce a second analog signal that approximates a desired signal, comprising the steps of:

coupling the first analog signal to a programmable transversal filter (PTF) including an acoustic charge transport device having a plurality of spaced taps each tap corresponding to an associated delayed first analog signal, each tap including means for providing a variable tap weight for modifying the filter response, wherein the PTF produces the second analog signal;

subtracting the output of the PTF from the desired signal to produce an error signal;

coupling the first analog signal to a time delay unit to provide a delayed first analog signal corresponding to a delayed first analog signal at a selected tap;

multiplying the delayed first analog signal from the time delay unit by the error signal to produce a gradient signal;

filtering the gradient signal to produce a filtered gradient signal;

converting the filtered gradient signal to a digital, filtered gradient signal;

deriving a new tap weight for said selected tap in response to the digital, filtered gradient signal; and varying the tap weight of the selected tap in accordance with the new tap weight to drive the second signal to more closely approximate the desired signal.

10. The method of claim 9, wherein the steps of coupling, multiplying, filtering, converting, deriving and varying are repeated for subsequently selected taps to derive corresponding new tap weights and to vary the tap weights of the subsequently selected taps to drive the second signal to more closely approximate the desired signal.

11. A method of adaptive filtering a first analog signal to produce a second analog signal that approximates a desired signal, comprising the steps of:

coupling the first analog signal to a programmable transversal filter (PTF) including an acoustic charge transport device having a plurality of spaced taps each tap corresponding to an associated delayed first analog signal, each tap including means for providing a variable tap weight for modifying the filter response, wherein the PTF produces the second analog signal;

comparing the output of the PTF with the desired signal to produce an error signal;

coupling the first analog signal to a time delay unit to provide a delayed first analog signal corresponding to a delayed first analog signal at a selected tap;

multiplying the delayed first analog signal from the time delay unit by the error signal to produce a gradient signal;

converting the gradient signal to a digital gradient signal;

deriving a new tap weight for said selected tap in response to the digital gradient signal; and varying the tap weight of the selected tap in accordance with the new tap weight to drive the second signal to more closely approximate the desired signal.

12. The method of claim 11, including the step of filtering the gradient signal.

* * * * *